United States Patent
Tsai et al.

(10) Patent No.: US 10,131,533 B1
(45) Date of Patent: Nov. 20, 2018

(54) MICROELECTROMECHANICAL SYSTEM DEVICE AND METHOD FOR MANUFACTURING THE SAME

(71) Applicant: TAIWAN SEMICONDUCTOR MANUFACTURING COMPANY LTD., Hsinchu (TW)

(72) Inventors: Shang-Ying Tsai, Taoyuan County (TW); Kuei-Sung Chang, Kaohsiung (TW); Yueh Kang Lee, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/637,154

(22) Filed: Jun. 29, 2017

Related U.S. Application Data (60) Provisional application No. 62/507,986, filed on May 18, 2017.

(51) Int. Cl.
*B81B 3/00* (2006.01)
*B81C 1/00* (2006.01)

(52) U.S. Cl.
CPC .......... *B81B 3/001* (2013.01); *B81C 1/00404* (2013.01); *B81B 2203/0127* (2013.01); *B81B 2203/0315* (2013.01); *B81B 2203/0361* (2013.01); *B81B 2207/012* (2013.01); *B81C 2201/0198* (2013.01); *B81C 2201/115* (2013.01)

(58) Field of Classification Search
CPC ..... B81B 3/001; B81B 3/0067; B81B 3/0075; B81B 3/0078; B81B 2203/0361
See application file for complete search history.

(56) References Cited

U.S. PATENT DOCUMENTS

| | | | |
|---|---|---|---|
| 8,723,280 B2 | 5/2014 | Shu et al. | |
| 9,065,358 B2 * | 6/2015 | Tsai | ............... H02N 1/00 |
| 9,422,151 B1 | 8/2016 | Tai et al. | |
| 2005/0229706 A1 * | 10/2005 | Vandemeer | ......... G01P 15/08 |
| | | | 73/514.38 |

* cited by examiner

*Primary Examiner* — Daniel Shook
(74) *Attorney, Agent, or Firm* — WPAT, P.C., Intellectual Property Attorneys; Anthony King (57) ABSTRACT

A MEMS device includes a first structure including at least one first bump over a surface of the first structure, a second structure including a first side facing the surface of the first bump and a second side opposite to the first side, and a gap between the first structure and the second structure. The first structure and the second structure are configured to move in relation to each other. The first bump includes a plurality of first teeth over a stop surface of the first bump.

20 Claims, 13 Drawing Sheets

Page(s) are shown.

MICROELECTROMECHANICAL SYSTEM DEVICE AND METHOD FOR MANUFACTURING THE SAME

PRIORITY CLAIM AND CROSS-REFERENCE

This patent claims the benefit of U.S. Provisional Patent Application Ser. No. 62/507,986 filed May 18, 2017, the entire disclosure of which is hereby incorporated by reference.

BACKGROUND

Microelectromechanical Systems (MEMS) device is micro-sized device, normally in a range from less than 1 micron to several millimeters in size. The MEMS device includes mechanical elements (stationary element and/or movable element) to sense a physical condition such as force, acceleration, pressure, temperature or vibration, and electronic elements to process electrical signals. The MEMS devices are widely used in applications such as automotive system, inertial guidance systems, household appliances, protection systems for a variety of devices, and many other industrial, scientific, and engineering systems. Moreover, MEMS applications are extended to optical applications, such as movable mirrors, and radio frequency (RF) applications, such as RF switches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, a device including a suspended movable portion and a bump is provided. The movable portion is suspended from e.g., a substrate with a space such as an air space. The bump is disposed adjacent to the movable portion to prevent the movable portion from being broken and/or adhered to the substrate or any structures overlying the substrate.

In the present disclosure, the device includes, but is not limited to, a Microelectromechanical Systems (MEMS) device, such as pressure sensor device, a microphone, a motion sensor device, an accelerometer device, or a gyroscope device. The suspended movable portion may include a proof mass, a vibrator, a diaphragm, an electrode, or any other movable structures.

As used herein, a "substrate" refers to a base material on which various layers and structures are formed. In some embodiments, the substrate includes a semiconductor substrate, such as a bulk semiconductor substrate. By way of example, the bulk semiconductor substrate includes an elementary semiconductor, such as silicon or germanium; a compound semiconductor, such as silicon germanium, silicon carbide, gallium arsenic, gallium phosphide, indium phosphide, or indium arsenide; or combinations thereof. In some embodiments, the substrate includes a multilayered substrate, such as a silicon-on-insulator (SOI) substrate, which includes a bottom semiconductor layer, a buried oxide layer (BOX) and a top semiconductor layer. In still some embodiments, the substrate includes an insulative substrate, such as a glass substrate, a conductive substrate, or any other suitable substrate. In some embodiments, the substrate is a doped semiconductor substrate.

As used herein, "suspended" refers to a structure disposed above and spaced away from another structure, thereby allowing the structure moving in at least one direction with respective to another structure.

As used herein, a "movable portion" refers to a structure that is suspended formed over the substrate or some part of the substrate with a space therebetween. Accordingly, the movable portion is able to move or swing when experiencing a force, an acceleration, a deceleration, a vibration, an impact or the like. In some embodiments, the movable portion is conductive. In some embodiments, the movable portion is covered with a conductive layer. In some embodiments, the movable structure is not conductive.

As used herein, a "fixed portion" refers to a structure that is immobile with respect to the movable structure when experiencing a force, an acceleration, a deceleration, a vibration, an impact or the like. The stationary portion or the fixed portion may be formed directly or indirectly on the substrate, or is a part of the substrate. In some embodiments, the fixed portion is conductive. In some embodiments, the fixed structure is covered with a conductive layer. In some embodiments, the fixed structure is not conductive.

As used herein, a "bump" is a structure configured as a buffer to reduce damage in a collision and to avoid undesired adhesion. As used herein, a "stop surface" is a surface of an element that contacts another element.

As used herein, "teeth" refer recessed or protruded structures that make an uneven or a rough surface of the bump. As used herein, a "recess" is a structure recessed from a perimeter or an edge of another structure, and a "protrusion" is a structure protruded from a perimeter or an edge of another structure. The protrusion can be either formed of the same material as or different materials from the structure where the protrusion is protruded.

Figure 1:
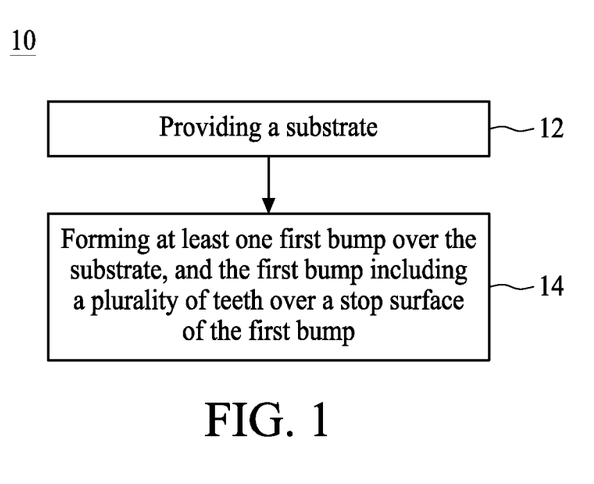
FIG. 1 is a flow chart representing a method for manufacturing an element of a MEMS device according to aspects of the present disclosure.
Figure 2:
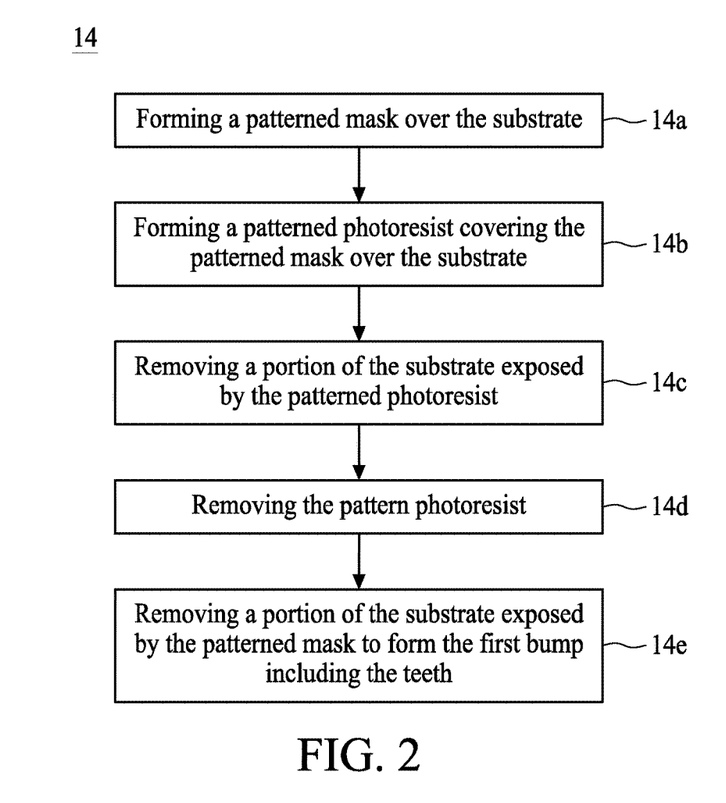
FIG. 2 is a flow chart representing a detailed operation of a method for manufacturing an element of a MEMS device according to aspects of the present disclosure in one embodiment.

FIG. 1 is a flow chart representing a method for manufacturing an element of a MEMS device according to aspects of the present disclosure in one embodiment, and FIG. 2 is a flow chart representing a detailed operation of a method for manufacturing an element of a MEMS device according to aspects of the present disclosure in one embodiment. The method for manufacturing the element of the MEMS device 10 includes an Operation 12: providing a substrate, and an Operation 14: forming at least one first bump over the substrate, and the first bump including a plurality of teeth over a stop surface of the first bump. Referring in FIG. 2, Operation 14 may include further operations in some embodiments of the present disclosure. For example, the Operation 14 may include an Operation 14a: forming a patterned mask on the substrate, an Operation 14b: forming a patterned photoresist covering the patterned mask over the substrate, an Operation 14c: removing a portion of the substrate exposed by the patterned photoresist, an Operation 14d: removing the pattern photoresist, and an Operation 14e: removing a portion of the substrate exposed by the patterned mask to form the first bump including the teeth. The method for forming the element of the MEMS device 10 is further described according to one or more embodiments.

FIGS. 3A through 3F illustrate sectional views of an element of a MEMS device at various fabrication stages constructed according to aspects of the present disclosure in some embodiments.

Figure 3A:
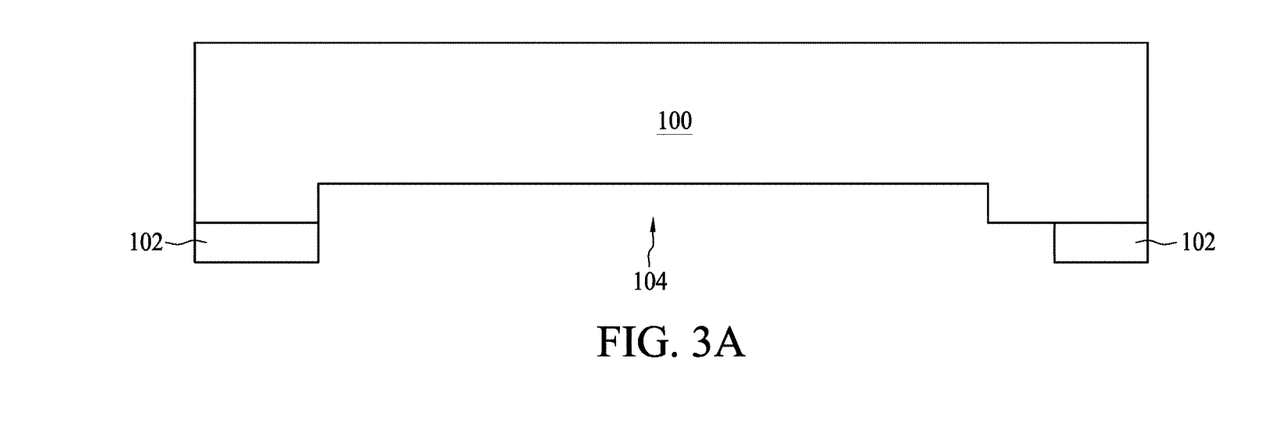
FIGS. 3A through 3F illustrate sectional views of an element of a MEMS device at various fabrication stages constructed according to aspects of the present disclosure in one or more embodiments.

Referring to FIG. 3A, a substrate 100 is provided as a capping structure according to Operation 12. A bonding material 102 is formed on the substrate 100 and is further patterned using a lithography process and an etching process. The bonding material 102 may include any suitable material for eutectic bonding or fusion bonding approach. A patterned photoresist (PR) layer (not shown) may be used as an etching mask to pattern the bonding material 102. In some embodiments of the present disclosure, the patterned bonding material 102 defines a bonding ring. The patterned PR layer or the patterned bonding material 102 can be used to in another etching process and a trench 104 (or a cavity) is formed. The aforementioned patterned PR layer can be removed after patterning the bonding material 102 or alternatively after forming the trench 104.

Figure 3B:
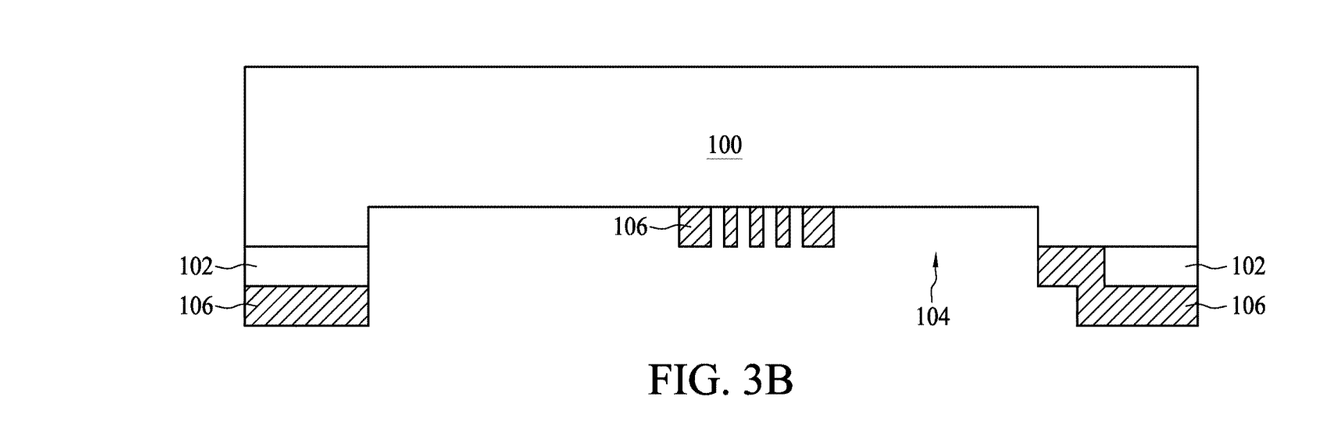

Referring to FIG. 3B, a patterned mask 106 is formed over the substrate 100 according to Operation 14a. The patterned mask 106 can be a silicon oxide layer formed on the substrate 100 and further patterned using lithography and etching. The pattered mask 106 is formed on the bonding material 102 and a portion of the substrate 100 in the trench 104. In some embodiments of the present disclosure, the patterned mask 106 defines bump or stopper locations.

Figure 3C:
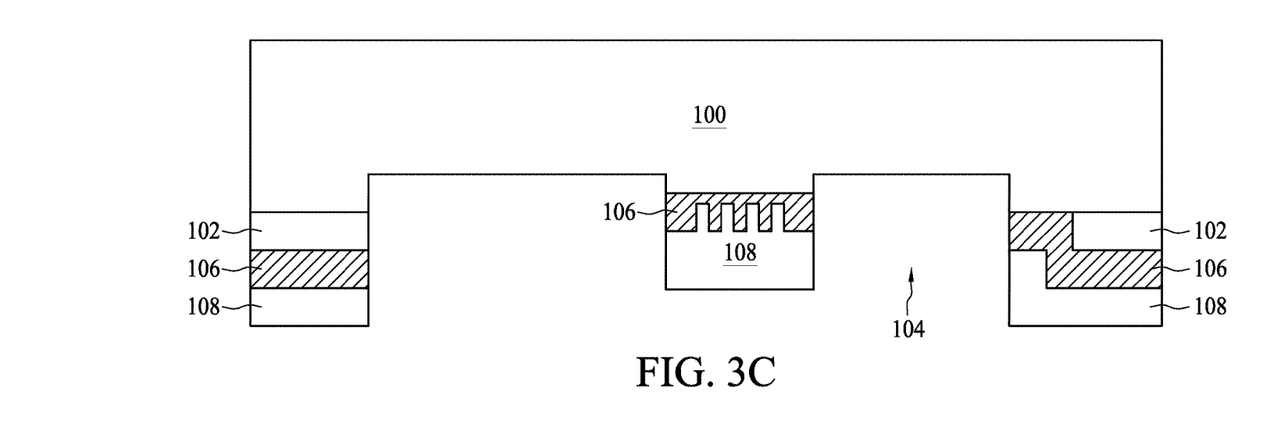

Referring to FIG. 3C, a patterned PR layer 108 covering the patterned mask 106 is formed over the substrate 100 in the trench 104 by lithography according to Operation 14b. In some embodiments of the present disclosure, the patterned PR layer 108 may define the geometry of the substrate 100.

Figure 3D:
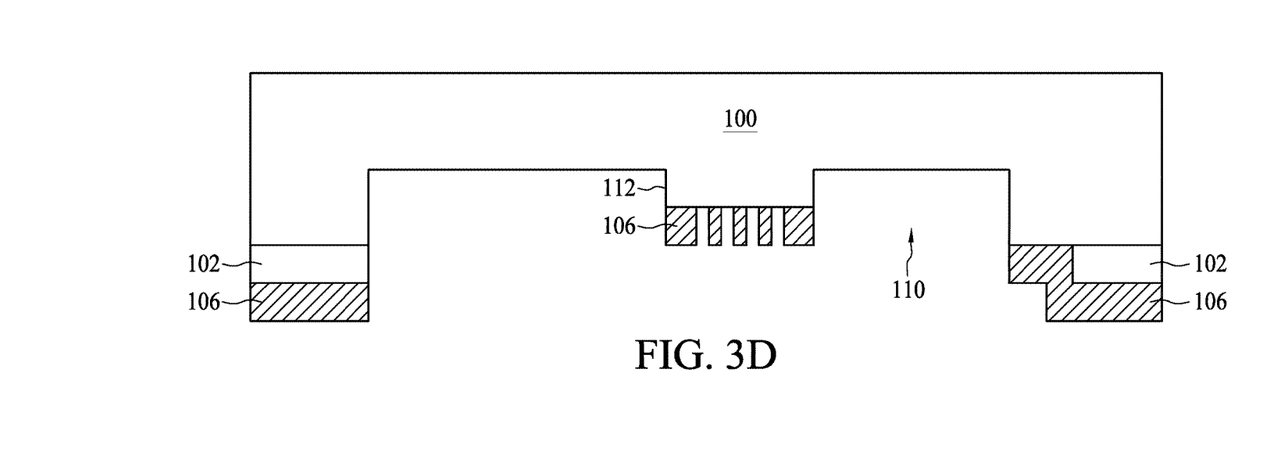

Referring to FIG. 3D, a portion of the substrate 100 in the trench 104 exposed by the patterned photoresist 108 is removed, resulting in a cavity 110 and at least one bump 112 in the cavity 110 according to Operation 14c. In some embodiments of the present disclosure, bonding features for bonding are formed correspondingly to the bonding material 102. Then the patterned PR layer 108 is removed by wet stripping, plasma ashing or the like according to Operation 14d.

Figure 3E:
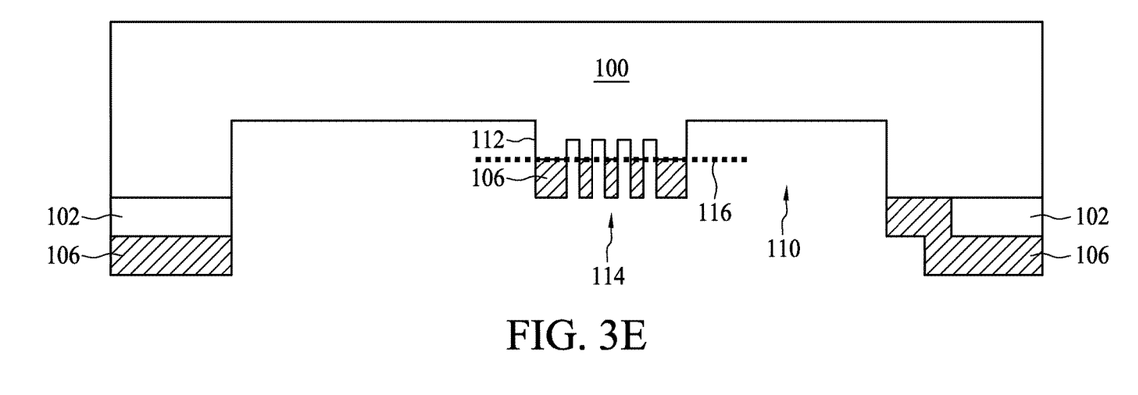
Figure 3F:
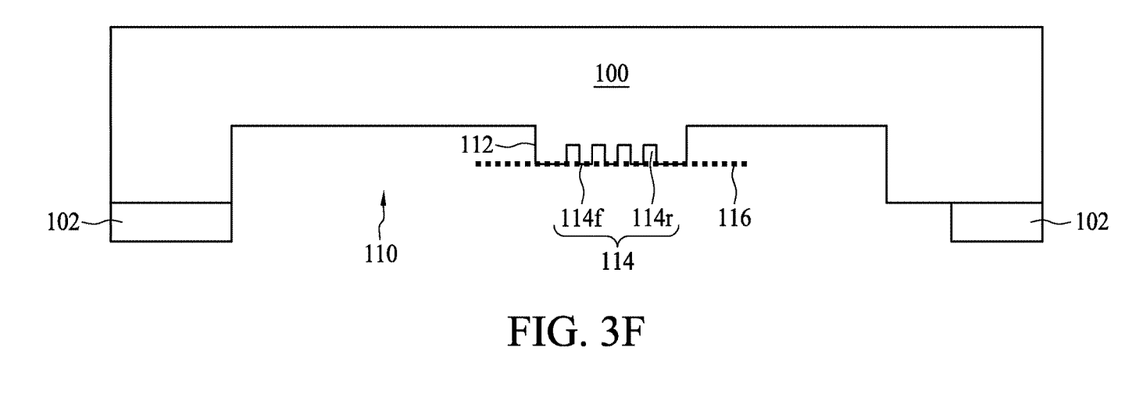

Referring to FIGS. 3E and 3F, a portion of the substrate 100 exposed by the patterned mask 106 is removed according to Operation 14e. During this etching, a portion of the substrate 100 is further removed to deepen the cavity 110, and a plurality of teeth 114 is formed on a stop surface 116 of the bump 112. Specifically, the teeth 114 can be formed by recessing portions of the bump 112. And the teeth 114 include a plurality of recesses 114r formed therebetween and recessed from the stop surface 116 of the bump 112. Referring to FIG. 3F, thereafter, the patterned mask 106 is removed for bonding, by a suitable process, such as hydrofluorine MO etching. As shown in FIG. 3F, a front end surface 114f of each tooth 114 is the stop surface 116 of the bump 112 while the recesses 114r between the teeth 114 are portions recessed from the stop surface 116 of the bump 112. In some embodiments of the present disclosure, the cavity 110 is deepened simultaneously with forming the teeth 114 due to micro loading effect.

FIGS. 4A through 4D illustrate sectional views of an element of a MEMS device at various fabrication stages constructed according to aspects of the present disclosure in other embodiments.

Referring to FIGS. 4A to 4D, the structure is similar in many respects to the structure 100 of FIGS. 3A-3F. Accordingly, similar features in FIGS. 3A-3F and 4A-4D are identified by the same reference numerals for clarity and simplicity. FIGS. 4A-4D have been simplified for the sake of clarity to better understand the inventive concepts of the present disclosure. The substrate 100 is provided as a capping structure according to Operation 12. The bonding material 102 is formed on the substrate 100 and is further patterned. The bonding material 102 may include any suitable material for eutectic bonding or fusion bonding approach. The trench 104 (or a cavity) can be formed thereafter. The patterned mask 106 is formed over the substrate 100 in the trench 104 and further patterned using lithography and etching according to Operation 14a. In some embodiments of the present disclosure, the patterned mask 106 defines bump or stopper locations. The patterned PR layer 108 covering the patterned mask 106 is formed over the substrate 100 by lithography according to Operation 14b. In the present embodiment, the patterned PR layer 108 covers lateral surfaces (or sidewalls) of the patterned mask 106.

Figure 4A:
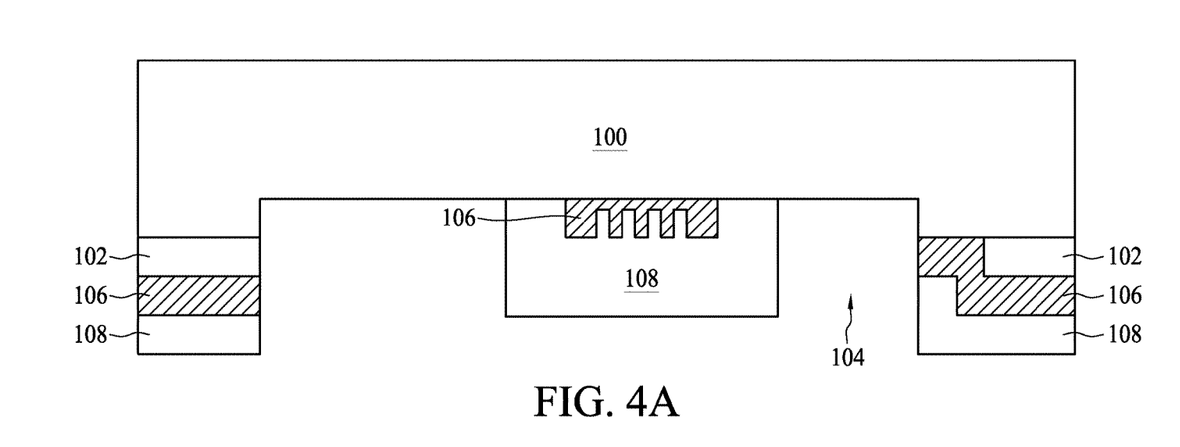
FIGS. 4A through 4D illustrate sectional views of an element of a MEMS device at various fabrication stages constructed according to aspects of the present disclosure in one or more embodiments.
Figure 4B:
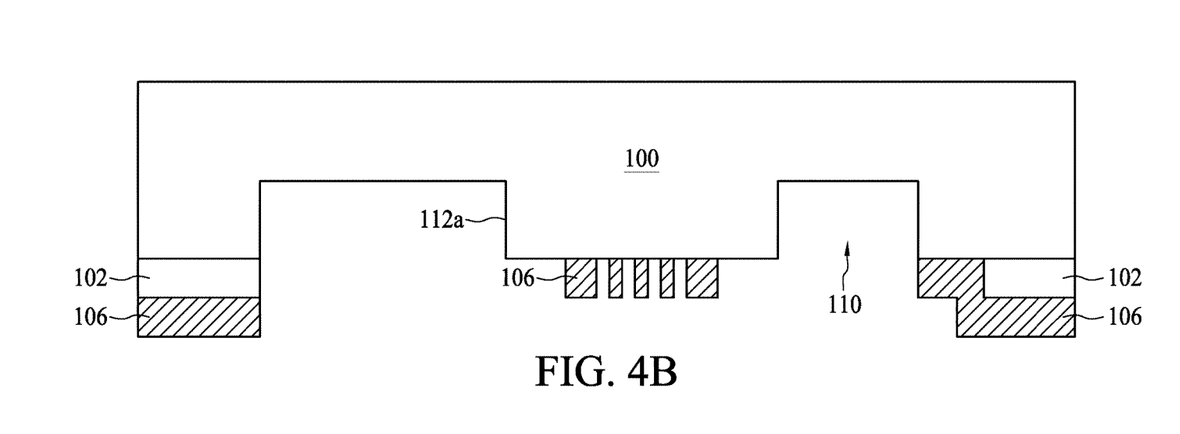

Referring to FIG. 4B, the substrate 100 is then etched using the patterned PR layer 108 as an etching mask, resulting in the cavity 110 and at least one bump 112a in the cavity 110 according to Operation 14c. In some embodiments of the present disclosure, bonding features for bonding are formed correspondingly to the bonding material 102. Thereafter the patterned PR layer 108 is then removed by wet stripping, plasma ashing or the like according to Operation 14d.

Figure 4C:
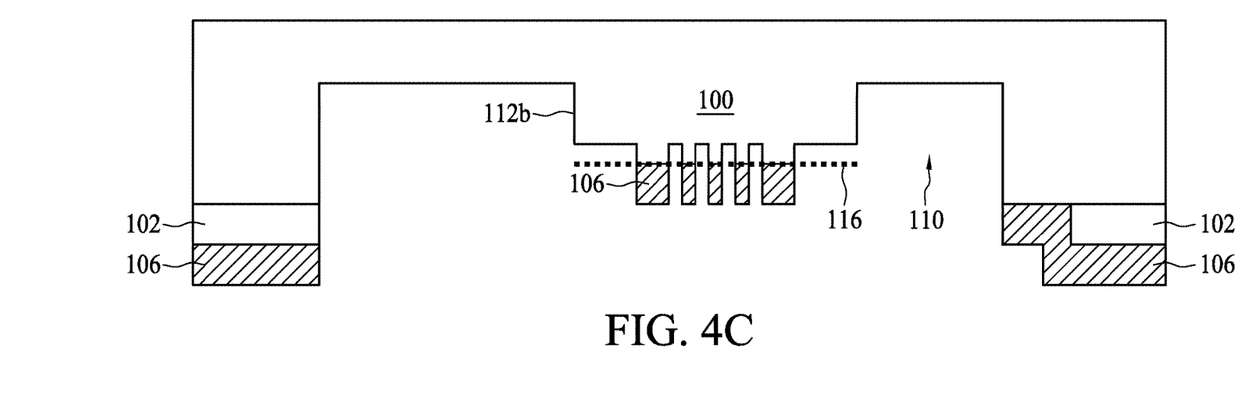
Figure 4D:
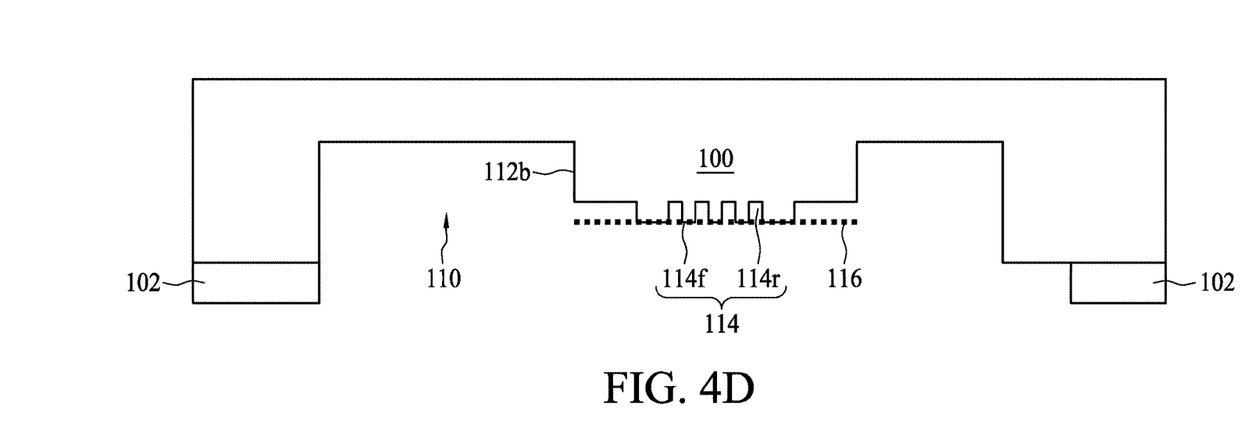

Referring to FIGS. 4C and 4D, the substrate 100 is further etched using the patterned mask 106 as an etching mask according to Operation 14e. During this etching, portions of the substrate 100 and portions of the bump 112a are further removed to deepen the cavity 110 and to form bump 112b including a pyramid shape. And a plurality of teeth 114 is formed on a stop surface 116 of the bump 112. Specifically, the teeth 114 can be formed by recessing portions of the bump 112, and the teeth 114 include a plurality of recesses 114r formed therebetween and recessed from the stop surface 116 of the bump 112. Referring to FIG. 4D, thereafter, the patterned mask 106 is removed for bonding, by a suitable process, such as hydro-fluorine (HF) etching. As shown in FIG. 4D, a front end surface 114f of each tooth 114 is the stop surface 116 of the bump 112 while the recesses 114r between the teeth 114 are portions recessed from the stop surface 116 of the bump 112. In some embodiments of the present disclosure, the cavity 110 is deepened simultaneously with forming the teeth 114 due to micro loading effect.

Figure 5A:
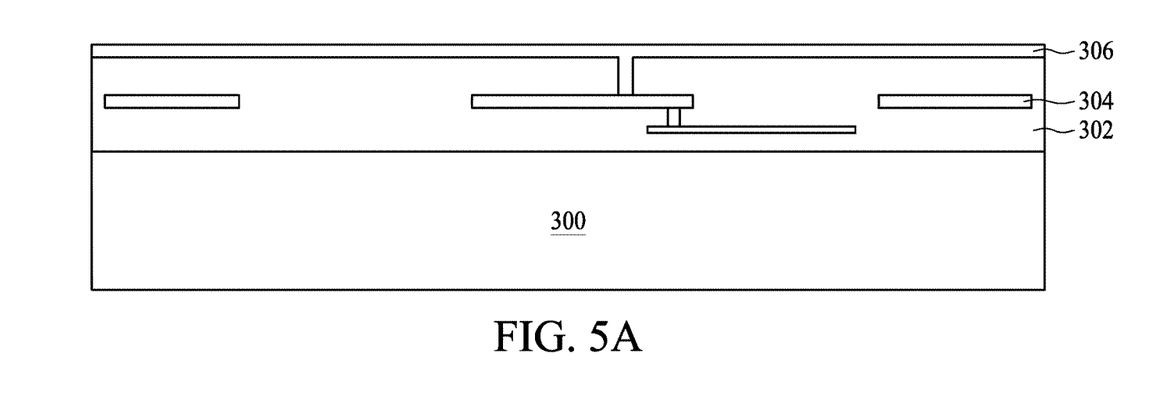
FIGS. 5A through 5C illustrate sectional views of another element of a MEMS device at various fabrication stages constructed according to aspects of the present disclosure in one or more embodiments.
Figure 5B:
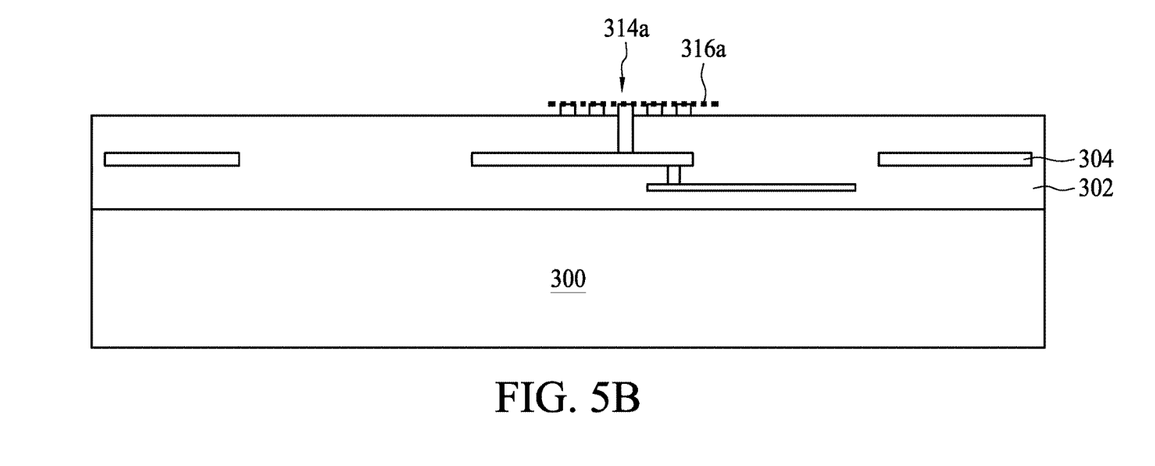
Figure 5C:
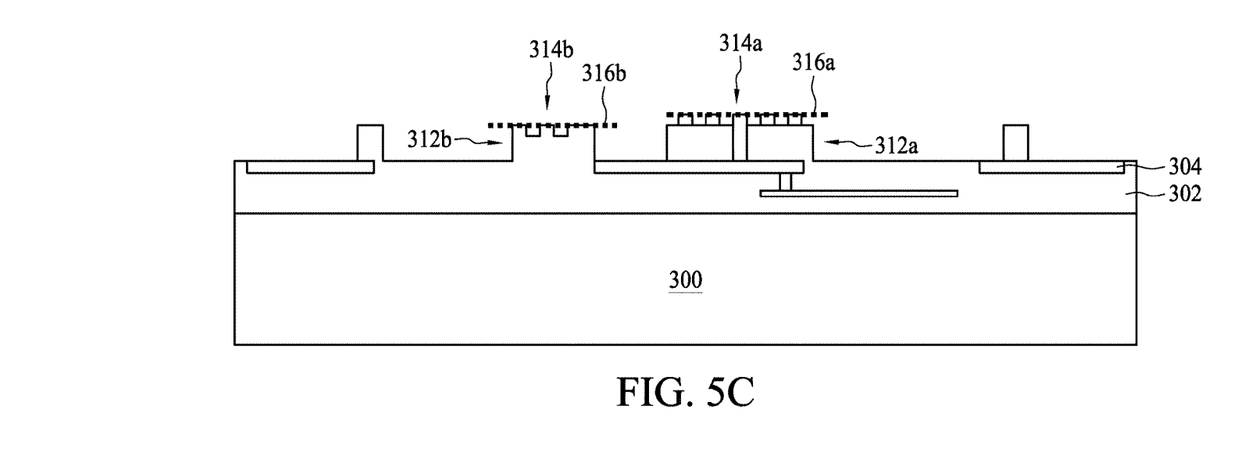

FIGS. 5A through 5C illustrate sectional views of another element of a MEMS device at various fabrication stages constructed according to aspects of the present disclosure in some embodiments.

Referring to FIG. 5A, a substrate 300 is provided as the CMOS structure according to Operation 12. Various devices (such as CMOS transistors) (not shown) and interconnect features (such as metal lines and vias/contacts) are formed thereon. In the present embodiment, dielectric layers 302 are formed over the substrate 300, and various metal features 304 are in the dielectric layers 302. A metal layer 306 is formed over the substrate. 300 by a suitable process.

Referring to FIG. 5B, the metal layer 306 is then patterned using lithography and etching. Consequently, a plurality of teeth 314a is formed over the substrate 300. In some embodiments of the present disclosure, at least one tooth 314a is electrically coupled to the metal features 304 for grounding. In the present embodiment, the teeth 314a are protruded from a surface of the substrate 300. Specifically, a front end surface 316a of each tooth 314a is protruded from the surface of the dielectric layer 302. In other words, a plurality of protrusions 314a protruded from the dielectric layer 302 and the substrate 300 is obtained.

Referring to FIG. 5C, a patterned mask (not shown) covering the teeth 314a and portions of the dielectric layer 302 can be formed over the substrate 300 according to Operation 14. And a portion of the substrate 300, for example, portions of the dielectric layer 302 exposed by the patterned mask is removed, resulting in a plurality of bumps 312a and 312b protruded from the substrate 300 according to Operation 14. During this etching, portions of the dielectric layer 302 are removed to form the bumps 312a and 312b while a plurality of teeth 314b is formed over a stop surface 316b of those bumps 3121. In the present embodiment, the teeth 314b can be formed by recessing portions of the bump 312b. In other words, a plurality of recesses being recessed from the stop surface 316b of the bump 312b is obtained. Thus, a front end surface of each tooth 314b is the stop surface 316b of the bump 312b while the recesses are portions recessed from the stop surface 316b of the bump 312b. On the other hand, the bump 312a is formed correspondingly to the teeth 314a, and the teeth 314a protruded from a surface of the bump 312a. The front end surfaces 316a of the teeth 314a may serve as stop surface for the third bump 312a. In the present embodiment, the teeth 314a and the bump 312a include different materials, and the teeth 314a and the teeth 3141) include different materials. In some embodiments of the present disclosure, the bumps 312a/312b are formed simultaneously with forming the teeth 314b due to micro loading effect.

Figure 6:
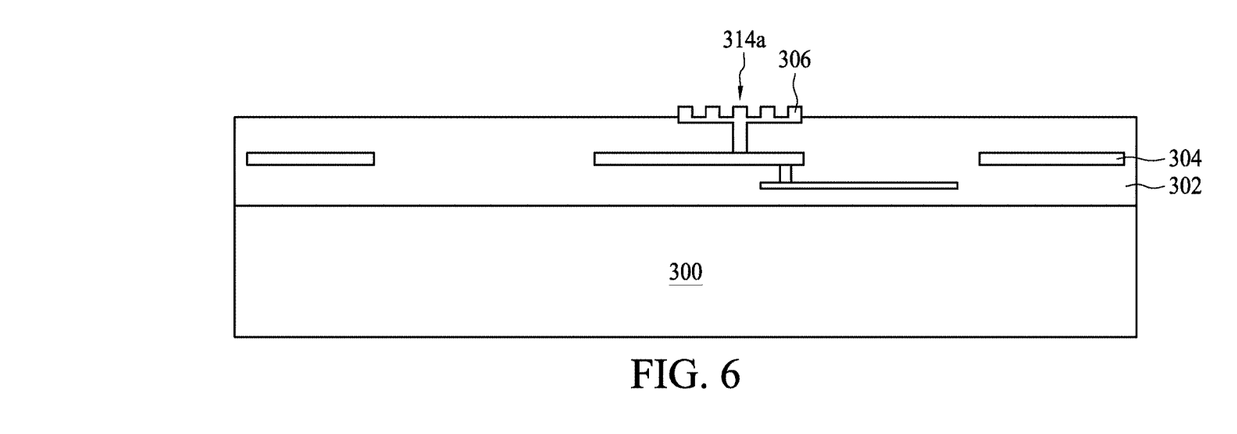
FIG. 6 illustrates a sectional view of an element of a MEMS device at a fabrication stage according to aspects of the present disclosure in one or more embodiments.

Referring to FIG. 6, in some embodiments of the present disclosure, the teeth 314a can be electrically coupled to each other and to the metal features 304 by the metal layer 306 for grounding.

Figure 7:
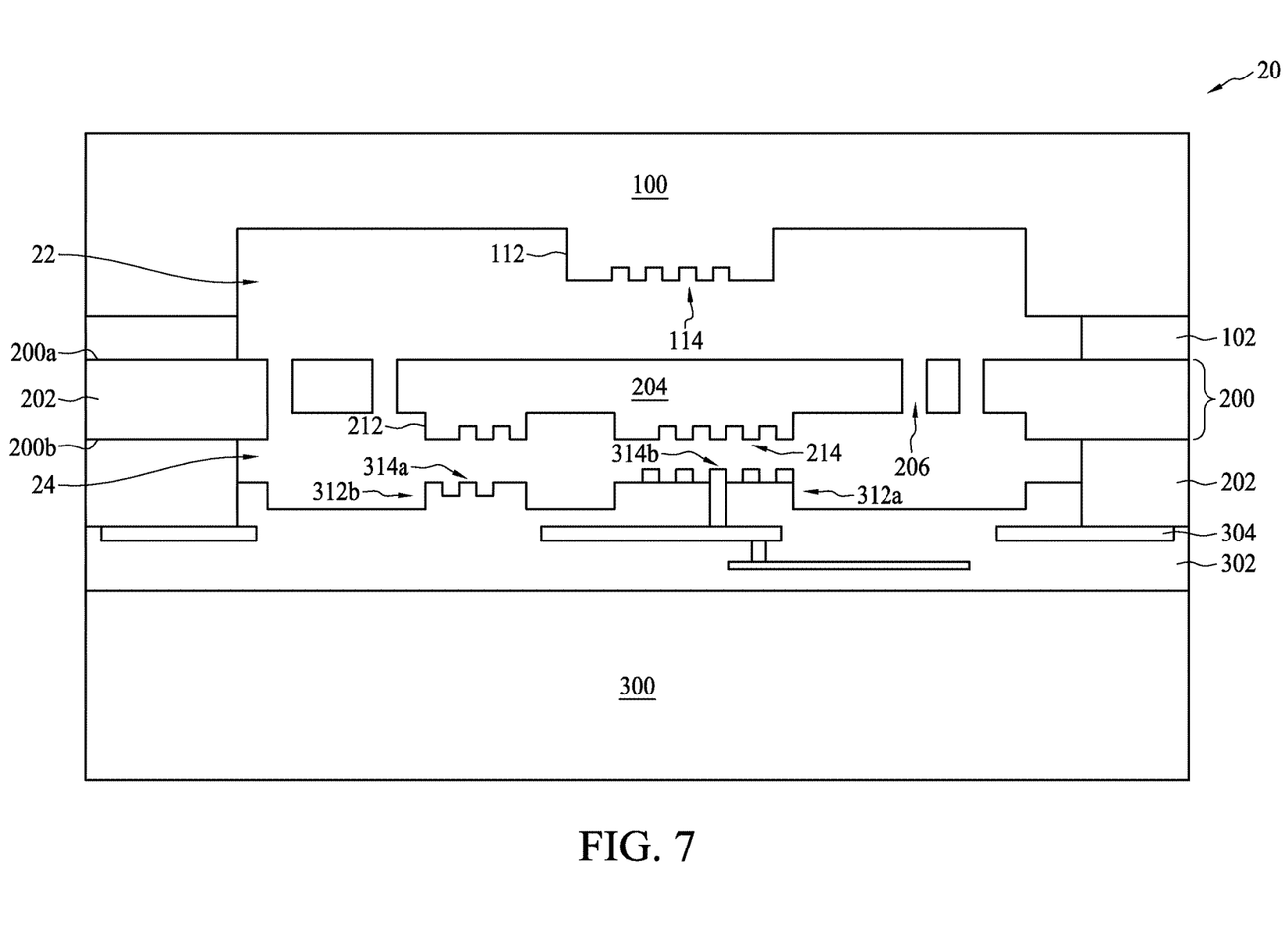
FIG. 7 is a schematic cross-sectional view of a MEMS device according to aspects of the present disclosure.
Figure 8:
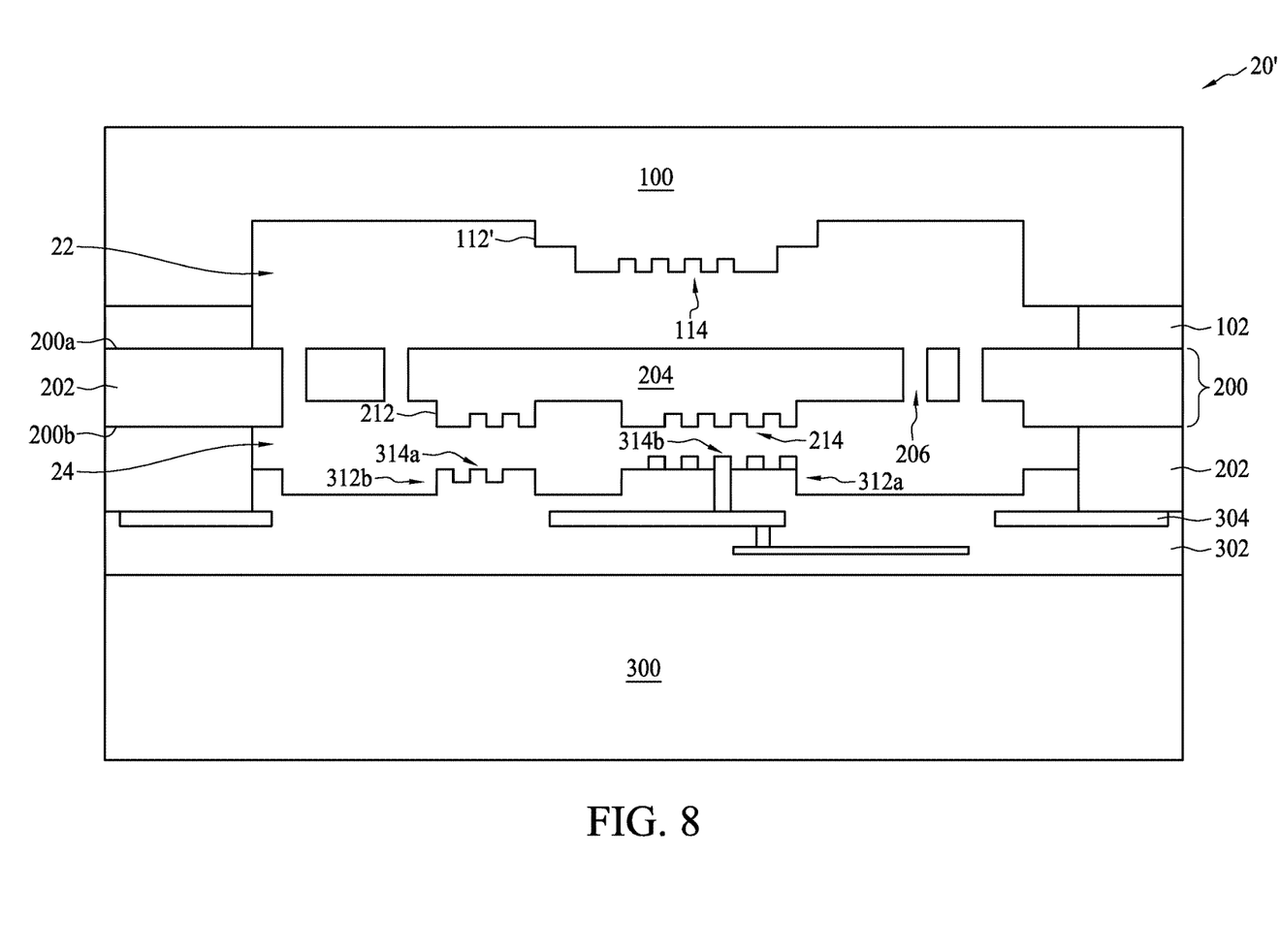
FIG. 8 is a schematic cross-sectional view of another MEMS device according to aspects of the present disclosure.

FIG. 7 is a schematic cross-sectional view of some embodiments of a MEMS device 20 according to aspects of the present disclosure, and FIG. 8 is a schematic cross-sectional view of some embodiments of a MEMS device 20' according to aspects of the present disclosure. The MEMS device 20 of the present embodiment can be a motion sensor. The motion sensor 20 includes the capping structure 100 as mentioned above, a MEMS structure 200 and the CMOS structure 300 as mentioned above. The capping structure 100 may be formed by the method described in FIG. 3A-3F or 4A-4D. The difference between the MEMS device 20 and the MEMS device 20' is the capping structure 100 can include the bump 112 including the plate shape or the bump 112' including the pyramid shape. The capping structure 100 can be boned to the MEMS structure 200 with the bonding materials 102 by fusion bonding or eutectic bonding approach. A gap 22 is sealed between the capping structure 100 and the MEMS structure 200, thus the MEMS structure 200 can move toward the capping structure 100 in the gap 22. The CMOS structure 300 may be formed by the method described in FIGS. 4A-4C. The CMOS structure 300 can be bonded to the MEMS structure 200 by fusion bonding or eutectic bonding. A gap 24 is sealed between the MEMS structure 200 and the CMOS structure 300, thus the MEMS structure 200 can move toward the CMOS structure 300 in the gap 24.

The MEMS structure 200 includes one or more motion sensors or other MEMS elements, therefore is also referred to as MEMS substrate. In some embodiments of the present disclosure, the MEMS structure 200 includes a substrate including a fixed portion 202 and a movable portion 204 having motions sensors formed thereon. The movable portion 204 is able to move toward the capping structure 100 and/or the CMOS structure 300. In the present disclosure, the substrate includes a first side 200a facing the capping structure 100 and a second side 200b opposite to the first side 200a. In some embodiments of the present disclosure, the second side 200b faces the CMOS structure 300. The motion sensors or other MEMS elements can be formed over the movable portion 204 by various processes including etching, lithography, or other suitable process. In other words, the MEMS structure 200 includes the movable portion 204 moving in the gaps/cavities between the capping structure 100 and the CMOS structure 300 and serving as an element of the motion sensor or other MEMS elements. The movable portion 204 can be partially separated from the fixed portion 202 by through holes 206.

Referring to FIGS. 7 and 8, the MEMS structure 200 may include a plurality of bumps 212 formed over the second side 202b of the movable portion 204. And the bumps 212 respectively include a plurality of teeth 214 over a stop surface. The teeth 214 can be formed by the method described in FIGS. 1 and 2, but not limited to this. Consequently, each of the teeth 214 may include a front end surface, which is also the stop surface of the bumps 212. And a plurality of recesses is recessed from the stop surface of the bumps 212. In some embodiments of the present disclosure, the bumps 212 over the substrate 200 are formed correspondingly to the bumps 312a and 312b, respectively.

Referring to FIGS. 7 and 8, the bump 112 over the capping structure 100 at the side facing the MEMS structure 200 is configured to constrain the movable portion 204 of the MEMS structure 200 when moving toward to the capping structure 100. The teeth 114 are configured to reduce contact area between the bump 112 and the movable portion 204. The bumps 212 over the MEMS structure 200 at the side 200b and the bumps 312a/312b over the CMOS structure 300 at the side facing the MEMS structure 200 are configured to constrain the movable portion 204 of the MEMS structure 200 when moving toward the CMOS structure 300. The teeth 214 are configured to reduce contact area between the bump 212 and the CMOS structure 300, and the teeth 314a and 314b are configured to reduce contact area between the bumps 312a/312b and the movable portion 204.

Figure 9:
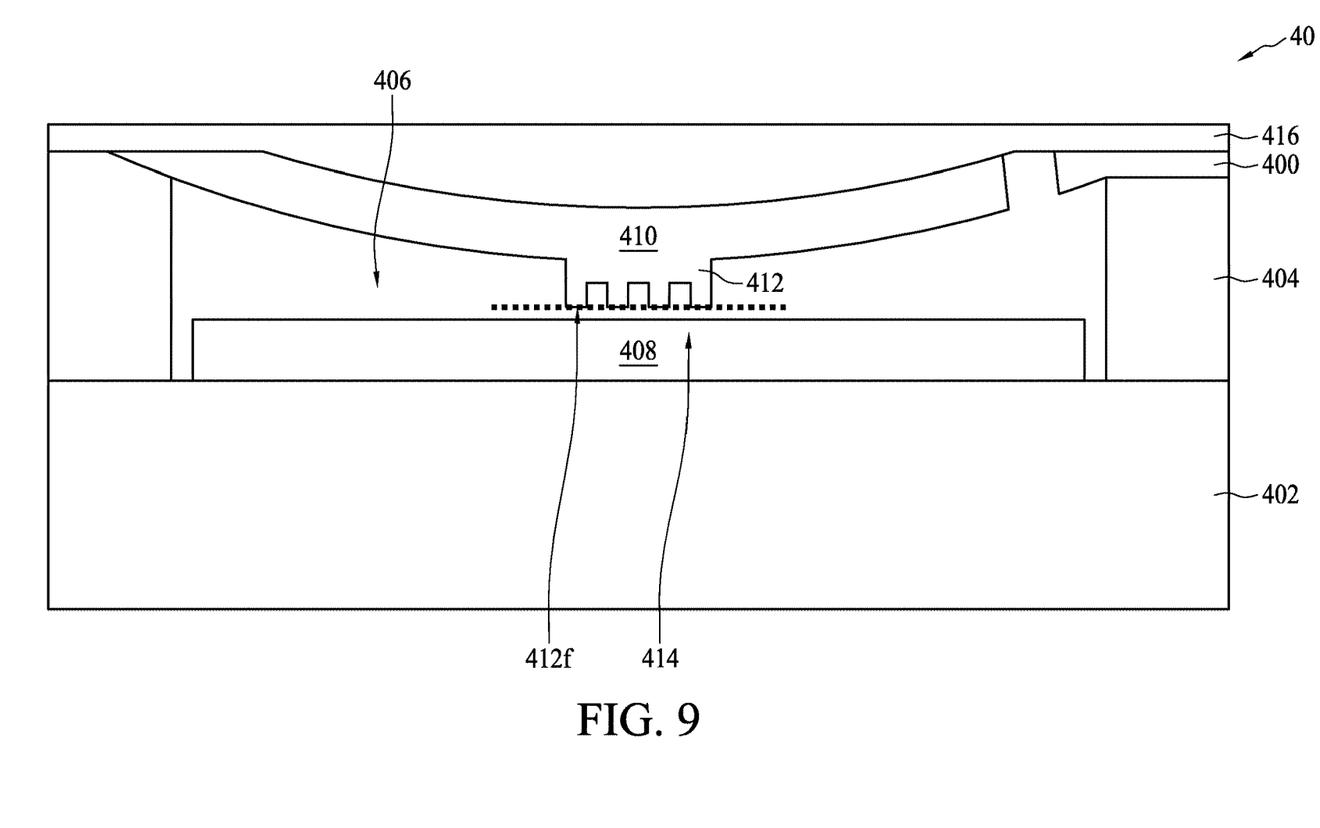
FIG. 9 is a schematic cross-sectional view of another MEMS device according to aspects of the present disclosure.

FIG. 9 is a schematic cross-sectional view of some embodiments of a MEMS device 40 according to aspects of the present disclosure. Referring to FIG. 9, the MEMS device 40 of the present embodiment can be a pressure sensor. The pressure sensor 40 includes a MEMS structure 400 and a CMOS structure 402 bonded by, for example but not limited to, a bonded material 404. The MEMS structure 400 and the CMOS structure 402 can be spaced apart from each other by a gap 406 formed therebetween. A first electrode 408 is over the CMOS structure 402, and a second electrode 410 is over the MEMS structure 400 at a side facing the first electrode 408. The second electrode 410 can be a movable portion of the MEMS structure 400, the second electrode 410 (the movable portion) is able to move toward the first electrode 408 over the CMOS structure 402 in the gap 406. At least one bump 412 is over the movable portion 410 at the side facing the first electrode 408, and a plurality of teeth 414 is over a stop surface 412f of the bump 412. The teeth 414 can be formed by the method described in FIG. 1, but not limited to this. The bump 412 is configured to constrain the movable portion 410, and the teeth 414 are configured to reduce contact area between the bump 412 and the first electrode 408. Additionally, the MEMS structure 400 can include a protection film 416 over the movable portion 410.

Figure 10:
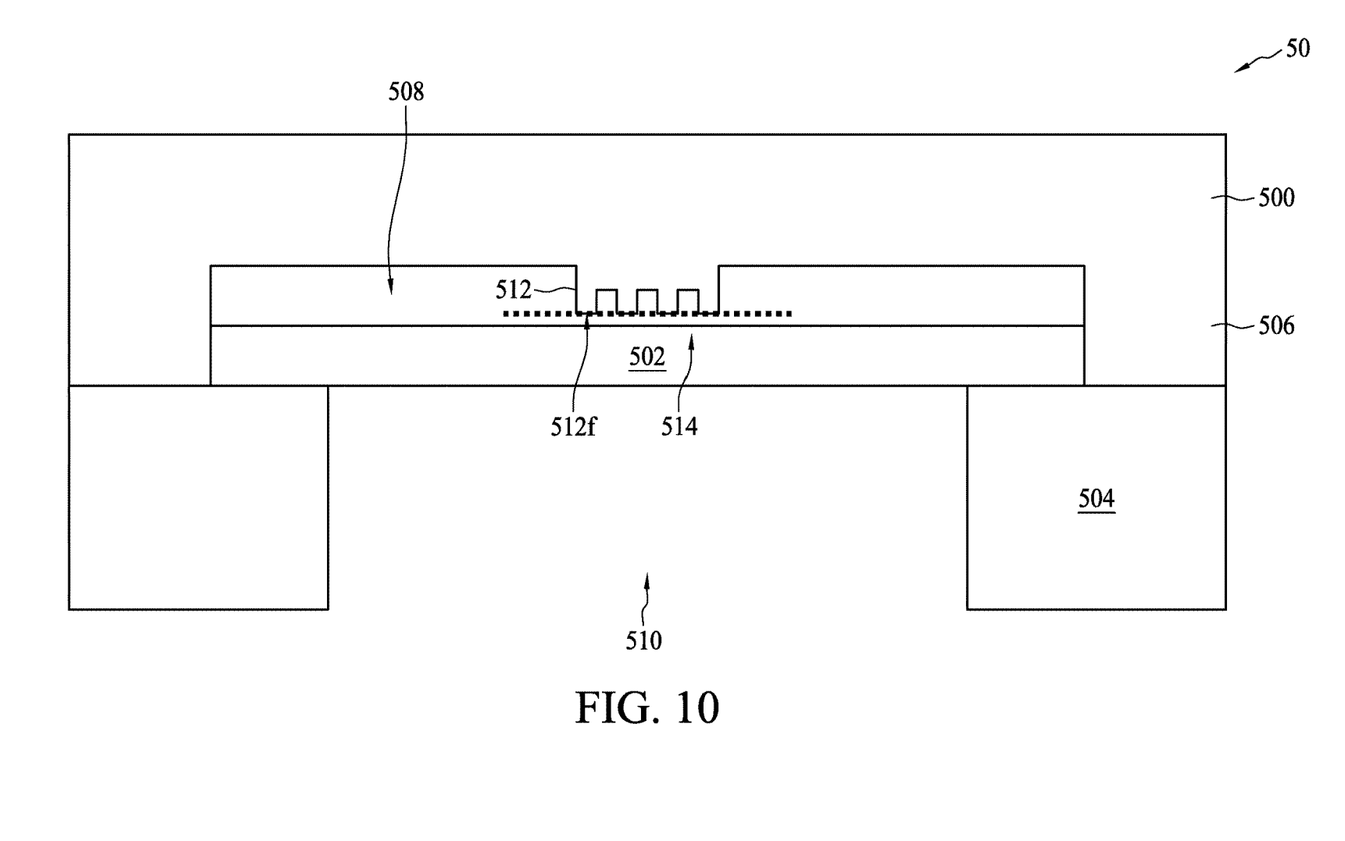
FIG. 10 is a schematic cross-sectional view of still another MEMS device according to aspects of the present disclosure.

FIG. 10 is a schematic cross-sectional view of some embodiments of a MEMS device 50 according to aspects of the present disclosure. Referring to FIG. 10, the MEMS device 50 of the present embodiment can be a microphone 50. The microphone 50 includes a CMOS structure 500, a MEMS structure 502, and a supporting structure 504. And the CMOS structure 500, the MEMS structure 502 and the supporting structure 504 can be bonded by, for example but not limited to, a bonded material 506. In the present embodiment, the MEMS structure 502 may include a movable portion such as a diaphragm. The MEMS structure 502 the CMOS structure 500 can be spaced apart from each other by a gap 508 formed therebetween while a vent hole 510 or other opening to ambient is formed in the supporting structure 504. Accordingly, the MEMS structure 502 is able to move toward the CMOS structure 500 or vibrate in the gap 508 due to acoustic wave.

As shown in FIG. 10, at least one bump 512 is over the CMOS structure 500 at a side facing the MEMS structure 502 and a plurality of teeth 514 is over a stop surface 512f of the bump 512. The bump 512 and the teeth 514 can be formed by the method described in FIG. 1, but not limited to this. The bump 512 is configured to constrain the movable portion of the MEMS structure 502, and the teeth 514 are configured to reduce contact area between the bump 512 and the MEMS structure 502.

In the present disclosure, the bump configured to constrain the movable portion of the MEMS structure includes the teeth. More important, the teeth over the stop surface of the bump or the teeth forming the stop surface of the bump make an uneven surface and thus contact area between the bump and the other structure is reduced. Accordingly, stiction is reduced.

In some embodiments, a MEMS device is provided. The MEMS device includes a first structure comprising at least one first bump over a surface of the first structure, a second structure comprising a first side facing the surface of the first bump and a second side opposite to the first side, and a gap between the first structure and the second structure. The first structure and the second structure are configured to move in relation to each other.

In some embodiments, a MEMS device is provided. The MEMS device includes a first structure including at least one first bump, a second structure bonded to the first structure, and a first gap between the first structure and the second structure. The first bump includes a plurality of first recesses being recessed from a stop surface of the first bump. The second structure includes a first side facing the surface of the first bump and a second side opposite to the first side.

In some embodiments, a method for manufacturing a MEMS device is provided. The method include providing a substrate, and forming at least one first bump over the substrate, and the first bump comprising a plurality of recesses being recessed from a surface of the first bump.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A MEMS device comprising:
  a first structure comprising at least one first bump over a surface of the first structure, the first bump comprising a plurality of first teeth over a stop surface of the first bump;
  a second structure comprising a first side facing the surface of the first structure and a second side opposite to the first side; and
  a gap between the first structure and the second structure, wherein the first structure and the second structure are configured to move in relation to each other, the second structure comprises a movable portion being able to move toward the first structure, and the first bump faces the movable portion, the second structure further comprises a plurality of second bumps over the movable portion, and the second bumps respectively comprise a plurality of second teeth over a stop surface of the second bumps.

2. The MEMS device according to claim 1, wherein each of the first teeth comprises a front end surface forming the stop surface of the first bump.

3. The MEMS device according to claim 1, wherein each of the second teeth comprises a front end surface forming the stop surface of the second bump.

4. The MEMS device according to claim 1, wherein the plurality of second bumps are at the second side.

5. The MEMS device according claim 4, further comprising a third structure comprising a third side facing the second structure.

6. The MEMS device according to claim 5, wherein the third structure comprises at least a third bump over the third side.

7. The MEMS device according to claim 6, wherein the third bump comprise a plurality of third teeth over a surface of the third bump.

8. The MEMS device according to claim 7, wherein the third teeth and the third bump comprise different materials.

9. The MEMS device according to claim 7, wherein at least one of the third teeth is electrically coupled to a metal feature in the third structure.

10. The MEMS device according to claim 7, wherein the first teeth and the third teeth comprise different materials.

11. The MEMS device according to claim 1, wherein the first structure further comprises a third bump comprising a plurality of third teeth over a surface of the third bump.

12. The MEMS device according to claim 11, wherein the plurality of second bumps are at the first side.

13. The MEMS device according to claim 11, wherein the third teeth and the third bumps comprise different materials.

14. The MEMS device according to claim 11, wherein the first teeth and the third teeth comprise different materials.

15. A MEMS device comprising:
    a first structure comprising at least one first bump, the first bump comprising a plurality of first recesses being recessed from a stop surface of the first bump;
    a second structure bonded to the first structure, the second structure comprising a first side facing the first bump and a second side opposite to the first side; and
    a gap between the first structure and the second structure, wherein the first structure comprises a movable portion and the first bump is over the movable portion.

16. The MEMS device according to claim 15, wherein the second structure comprises a first electrode, and the movable portion of the first structure comprises a second electrode.

17. The MEMS device according to claim 16, further comprising a protection film over the movable portion.

18. A method for manufacturing a MEMS device, comprising:
    providing a substrate;
    forming a patterned mask over the substrate;
    forming a patterned photoresist covering the patterned mask over the substrate;
    removing a portion of the substrate exposed by the patterned photoresist;
    removing the pattern photoresist; and
    removing a portion of the substrate exposed by the patterned mask to form a cavity and to form at least one first bump over the substrate and in the cavity, and the first bump comprising a plurality of teeth over a stop surface of the first bump.

19. The method of claim 18, wherein the substrate comprises at least a movable portion, and the first bump is over the movable portion.

20. The method of claim 18, further comprising following operations:
    forming a metal layer on the substrate;
    patterning the metal layer to form a plurality of protrusions over the substrate;
    forming a patterned mask over the substrate; and
    removing portions of the substrate exposed by the patterned mask to form the first bump comprising the teeth and at least a second bump, wherein the protrusions are over the second bump.

* * * * *